US011726689B2

(12) United States Patent
Nowell et al.

(10) Patent No.: US 11,726,689 B2
(45) Date of Patent: Aug. 15, 2023

(54) TIME-BASED COMBINING FOR BLOCK FAMILIES OF A MEMORY DEVICE

(71) Applicant: MICRON TECHNOLOGY, INC., Boise, ID (US)

(72) Inventors: Shane Nowell, Boise, ID (US); Michael Sheperek, Longmont, CO (US); Vamsi Pavan Rayaprolu, San Jose, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/100,712

(22) Filed: Nov. 20, 2020

(65) Prior Publication Data
US 2022/0164106 A1    May 26, 2022

(51) Int. Cl.
*G06F 3/06* (2006.01)
(52) U.S. Cl.
CPC ............ *G06F 3/064* (2013.01); *G06F 3/0604* (2013.01); *G06F 3/0614* (2013.01); *G06F 3/0644* (2013.01); *G06F 3/0653* (2013.01); *G06F 3/0659* (2013.01); *G06F 3/0679* (2013.01)
(58) Field of Classification Search
USPC ........................................................ 711/154
See application file for complete search history.

(56) References Cited

U.S. PATENT DOCUMENTS

| 8,799,927 | B1* | 8/2014 | Taylor .................... G06F 3/00 719/311 |
| 2013/0060994 | A1* | 3/2013 | Higgins ............. G06F 12/0246 711/E12.008 |
| 2016/0141042 | A1 | 5/2016 | Peterson et al. |
| 2016/0291871 | A1* | 10/2016 | Kim ....................... G06F 3/064 |
| 2017/0271031 | A1 | 9/2017 | Sharon et al. |
| 2018/0033491 | A1* | 2/2018 | Marelli ................. G11C 16/26 |
| 2019/0080747 | A1* | 3/2019 | Sakurada .............. G11C 16/26 |
| 2019/0179549 | A1* | 6/2019 | de la Serna ........ G06F 15/7867 |
| 2019/0179698 | A1 | 6/2019 | Liu et al. |
| 2020/0066353 | A1* | 2/2020 | Pletka ................... G06F 3/0604 |

OTHER PUBLICATIONS

Extended European search report for application No. 21209388.4 dated Apr. 14, 2022, 11 pages.

* cited by examiner

*Primary Examiner* — Charles Rones
*Assistant Examiner* — Jonah C Krieger
(74) *Attorney, Agent, or Firm* — Lowenstein Sandler LLP

(57) ABSTRACT

An example memory sub-system includes a memory device and a processing device, operatively coupled to the memory device. The processing device is configured to determine that a first block family of a plurality of block families of the memory device and a second block family of the plurality of block families satisfy a proximity condition; determine whether the first block family and the second block family meet a time-based combining criterion corresponding to the proximity condition; and responsive to determining that the first block family and the second block family meet the time-based combining criterion, merge the first block family and the second block family.

18 Claims, 12 Drawing Sheets

TIME-BASED COMBINING FOR BLOCK FAMILIES OF A MEMORY DEVICE

TECHNICAL FIELD

Embodiments of the disclosure are generally related to memory sub-systems, and more specifically, are related to time-based combining for block families of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
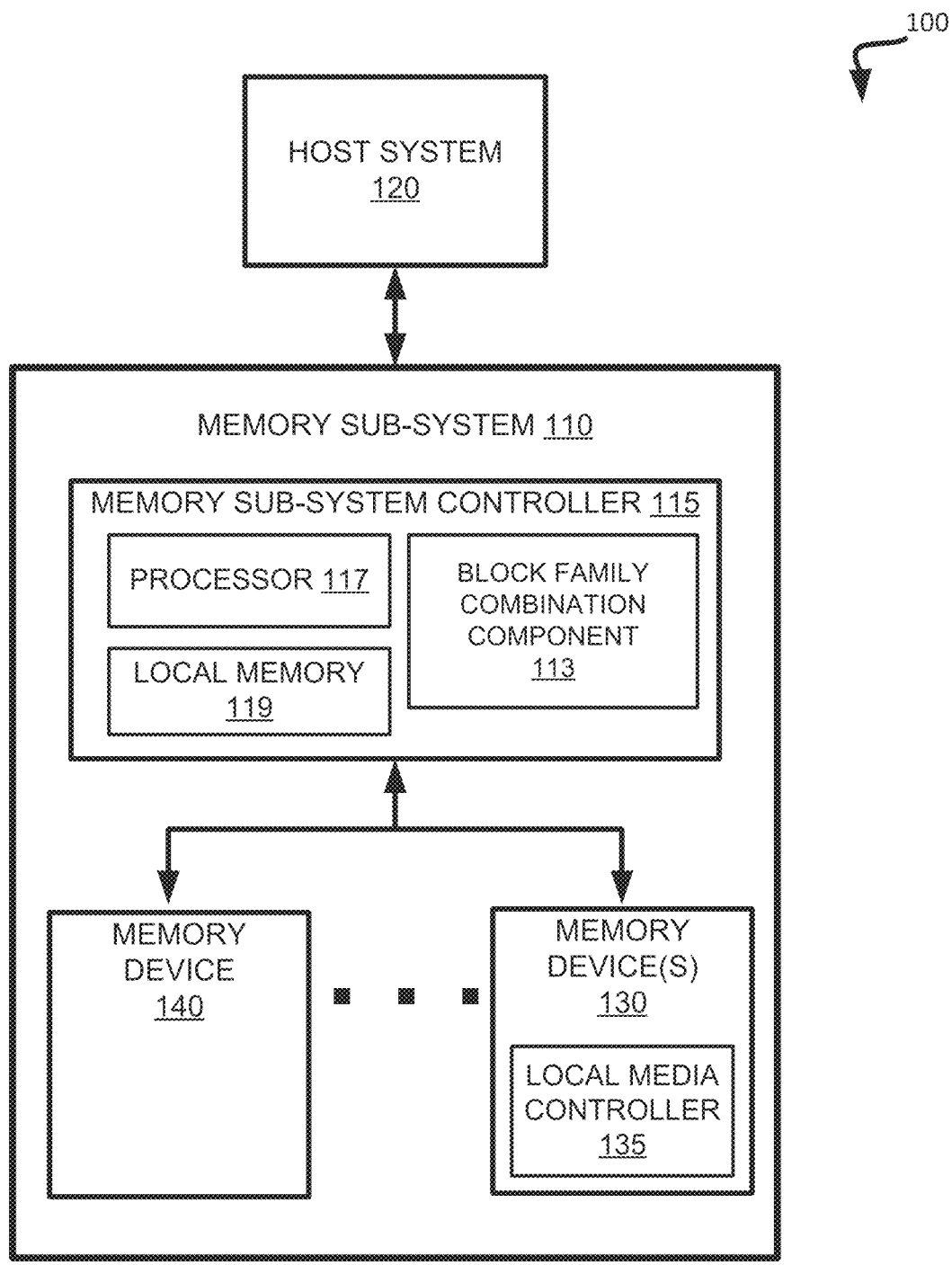
FIG. 1 illustrates an example computing system that includes a memory sub-system in accordance with some embodiments of the present disclosure.

Embodiments of the present disclosure are directed to block family combination management for block families of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system. In accordance with embodiments of the present disclosure, the temporal voltage shift is selectively tracked for programmed blocks grouped by block families, and appropriate voltage offsets, which are based on block affiliation with a certain block family, are applied to the base read levels in order to perform read operations. "Block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die of every block family with one of the predefined threshold voltage offset bins, which is in turn associated with the voltage offset to be applied for read operations. The associations of blocks with block families and block families and dies with threshold voltage offset bins can be stored in respective metadata tables maintained by the memory sub-system controller.

More specifically, the present disclosure addresses the ability to combine block families based on a time-based combination criterion by combining two adjacent block families when a predefined time period elapses since the start of the older of the two block families, in order to efficiently manage the number of block families within the memory sub-system while avoiding the overhead of a scan process.

In accordance with embodiments of the present disclosure, a start time and an end time for each block family within a memory sub-system can be recorded in order to determine whether or not any two block families are temporally adjacent. The start time refers to the time at which a block family was created and assigned as the current block family in the system, and the end time refers to the time at which the block family ceases to be the current block family in the system. In implementations, when the difference between the end time of one block family and the start time of another block family is equal to, or less than, a predetermined time period, the two block families can be marked as temporally adjacent block families. When the two block families are determined to be temporally adjacent, the two temporally adjacent block families can be combined when a certain time period (e.g., a multiplier of the predetermined time period utilized for determining whether the black families are temporally adjacent) has elapsed since the opening of the older of the two adjacent block families. Combining two block families together can refer to merging the blocks of the first block family into the second block family, then deleting the first block family.

In some embodiments, the memory sub-system can have multiple threshold voltage offset bins for classifying block families based on threshold voltage offsets of each block family. A threshold voltage offset bin defines a set of threshold voltage offsets to be applied to a base voltage read level in order to perform read operations on blocks of the block families associated with the bin. Each threshold voltage offset bin within the memory sub-system can have a separate time multiplier for determining when to merge block families within each threshold voltage offset bin, such that the time multiplier per bin can be adjusted based on the threshold voltage offsets associated with the bin. In one embodiment, the two adjacent block families can be combined when the time-based criterion (e.g., time multiplier of the predetermined time period has elapsed since the start of the first block family) is satisfied, without making further scans or verifications. In another embodiment, after satisfying the time-based criterion, a voltage-based criterion can be determined before combining the two adjacent block families. The voltage-based criterion can be determining whether a data state metric of one block family is within a predetermined variance of a data state metric of the other block family. A data state metric of a block family can indicate the temporal voltage shift (TVS) of the blocks associated with the block family. If the two adjacent block families satisfy the voltage-based criterion, the two adjacent block families can be combined.

In yet another embodiment, block families assigned to new threshold voltage offset bins can be combined based on a time-based combining criterion. On the other hand, block families assigned to old threshold voltage offset bins can be combined based on a voltage-based combining criterion. Additionally, the one or more time multipliers within the memory sub-system 110 can be adjusted based on the temperature of the memory devices of the memory subsystem, in order to accommodate the different rate threshold voltages convergence at higher temperatures, as explained in more details herein below.

Therefore, advantages of the systems and methods implemented in accordance with some embodiments of the present disclosure include, but are not limited to, improving the bit error rate in read operations by maintaining metadata tracking groups of blocks (block families) that are presumed to exhibit similar voltage distributions. Additionally, the present disclosure enables the ability to merge block families together based on proximity in time of starting of a block family and ending of another block family, without performing expensive scan operations, thus minimizing any additional overhead on the memory sub-system, as described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family combination component 113, which can be used to implement techniques for combining block families within memory sub-system 110 based primarily on time-based criteria, in accordance with embodiments of the present disclosure. In some embodiments, block family combination component 113 can record a start time and an end time for each block family within the memory sub-system 110. The start time can be the time at which a block family was created and assigned as the current block family in the system, and the end time is the time at which the block family ceases to be the current block family in the system. In implementations, when block family combination component 113 determines that the difference between the end time of one block family and the start time of another block family is equal to, or less than, a predetermined time period (e.g., 1 hour), block family combination component 113 can determine that the two block families are adjacent. In certain implementations, in order to determine that the two block families are adjacent, block family combination component 113 further determines that the two block families are assigned to the same threshold voltage offset bin. A threshold voltage offset bin defines a set of threshold voltage offsets to be applied to a base voltage read level in order to perform read operations on blocks of the respective block family.

Subsequent to determining that the two block families are adjacent, block family combination component 113 can determine that the two adjacent block families can be combined when a second time period that is a certain time multiplier of the time period has elapsed. As an example, block family combination component 113 can determine that the two adjacent block families can be combined when 24 hours has elapsed since the opening of the older of the two adjacent block families (e.g., time multiplier is 24). Combining two block families together can refer to merging the blocks of the first block family into the second block family, then deleting the first block family.

In certain implementations, each threshold voltage offset bin within memory sub-system can have a separate time multiplier for determining when to combine block families assigned to the respective threshold voltage offset bin, such that the time multiplier per bin can be adjusted based on the threshold voltage offsets associated with the bin, as explained in more details below. In this case, two block families (e.g., A and B) that are assigned to a first threshold voltage offset bin can be combined based on the time multiplier associated with the first threshold voltage offset bin, whereas two block families (e.g., C and D) that are assigned to a second threshold voltage offset bin can be combined based on the time multiplier associated with the second threshold voltage offset bin.

In one implementation, block family combination component 113 can combine the two adjacent block families when the second time period has elapsed, without making further scans or verifications. In another implementation, when block family combination component 113 determines that the second time period has elapsed, block family combination component 113 can make as additional determination to find out if the two adjacent block families satisfy a voltage-based criterion, before combining the two block families. As an example, the voltage-based criterion can be determining whether a data state metric of one block family is within a predetermined variance of a data state metric of the other block family. A data state metric of a block family can indicate the temporal voltage shift (TVS) of the blocks associated with the block family. In this case, if the two adjacent block families satisfy the voltage-based criterion, block family combination component 113 can combine the two adjacent block families.

In yet another implementation, block family combination component 113 can utilize a time-based combining criterion for new threshold voltage offset bins (i.e., bins that are associated with threshold voltage offsets corresponding to time after program that is shorter than a threshold) and a voltage-based combining criterion for old threshold voltage offset bins (i.e., bins that are associated with threshold voltage offsets corresponding to time after program that is longer than the threshold). When the time after program for a given block family is short, the frequency of change in threshold voltage offsets associated with the block family can be high, thus measuring a data state for determining a voltage-based criterion can be inaccurate and/or expensive to perform. On the other hand, when the time after program for the block family is long, the frequency of change in threshold voltage offsets associated with the block family can be low, thus measuring the data state for determining a voltage-based criterion for this block family can be more accurate and/or less expensive than it is in the previous case. Therefore, for combining two block families, block family combination component 113 can utilize a time-based combining criterion (e.g., the passage of a certain time period that is associated with the start time of one of the two block families and the end time of the other block family) for new threshold voltage offset bins. Similarly, block family combination component 113 can use a voltage-based combining criterion (e.g., by measuring and comparing a data state metric for each block family) for old threshold voltage offset bins, as explained in more details herein below.

In some implementations, block family combination component 113 can adjust the one or more time multipliers within memory sub-system 110 based on the temperature of memory devices 130-140. As an example, when memory device 130 is held at a high temperature, the convergence of threshold voltages associated with reading blocks of memory device 130 can happen at a faster rate than it does at normal/lower temperature. Accordingly, block family combination component 113 detects a high temperature of memory device 130, block family combination component 113 can shorten the one or more time multipliers associated with memory device 130 to reflect the faster convergence of the threshold voltages.

Figure 2:
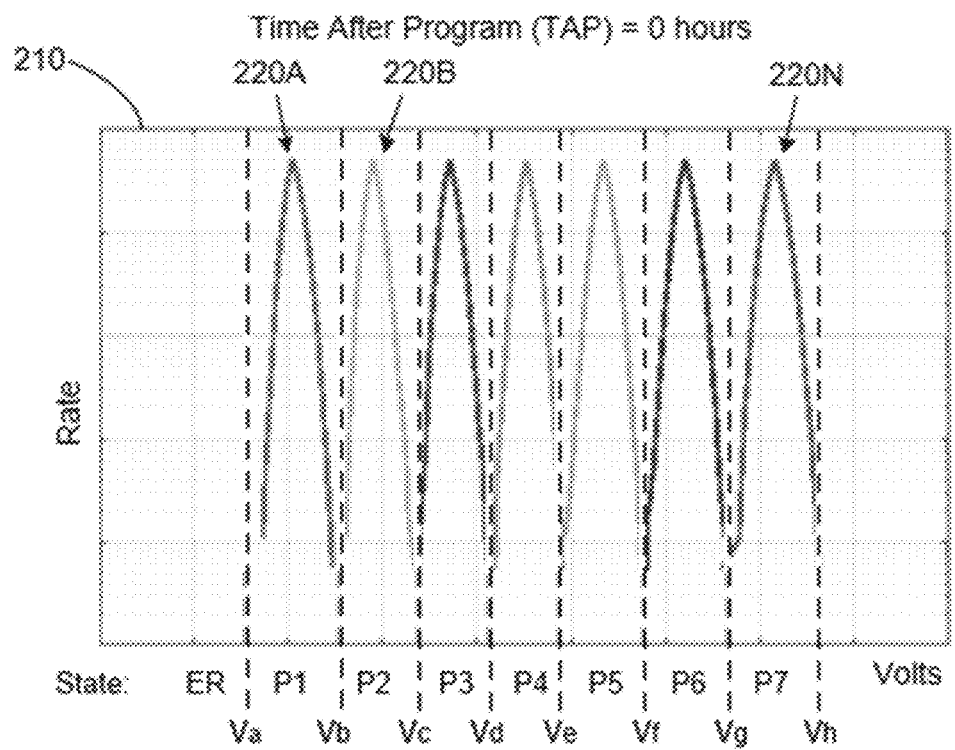
FIG. 2 schematically illustrates the temporal voltage shift caused by the slow charge loss exhibited by triple-level memory cells, in accordance with some embodiments of the present disclosure.
Figure 2:
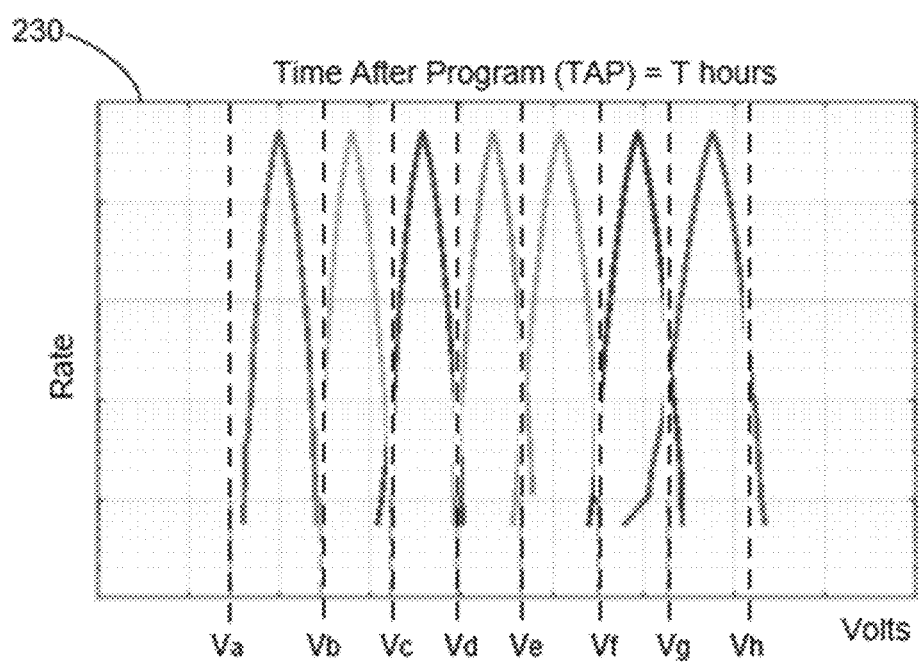

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-420N (also referred to as "program distributions" or "voltage distributions" or "distributions" or "levels" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
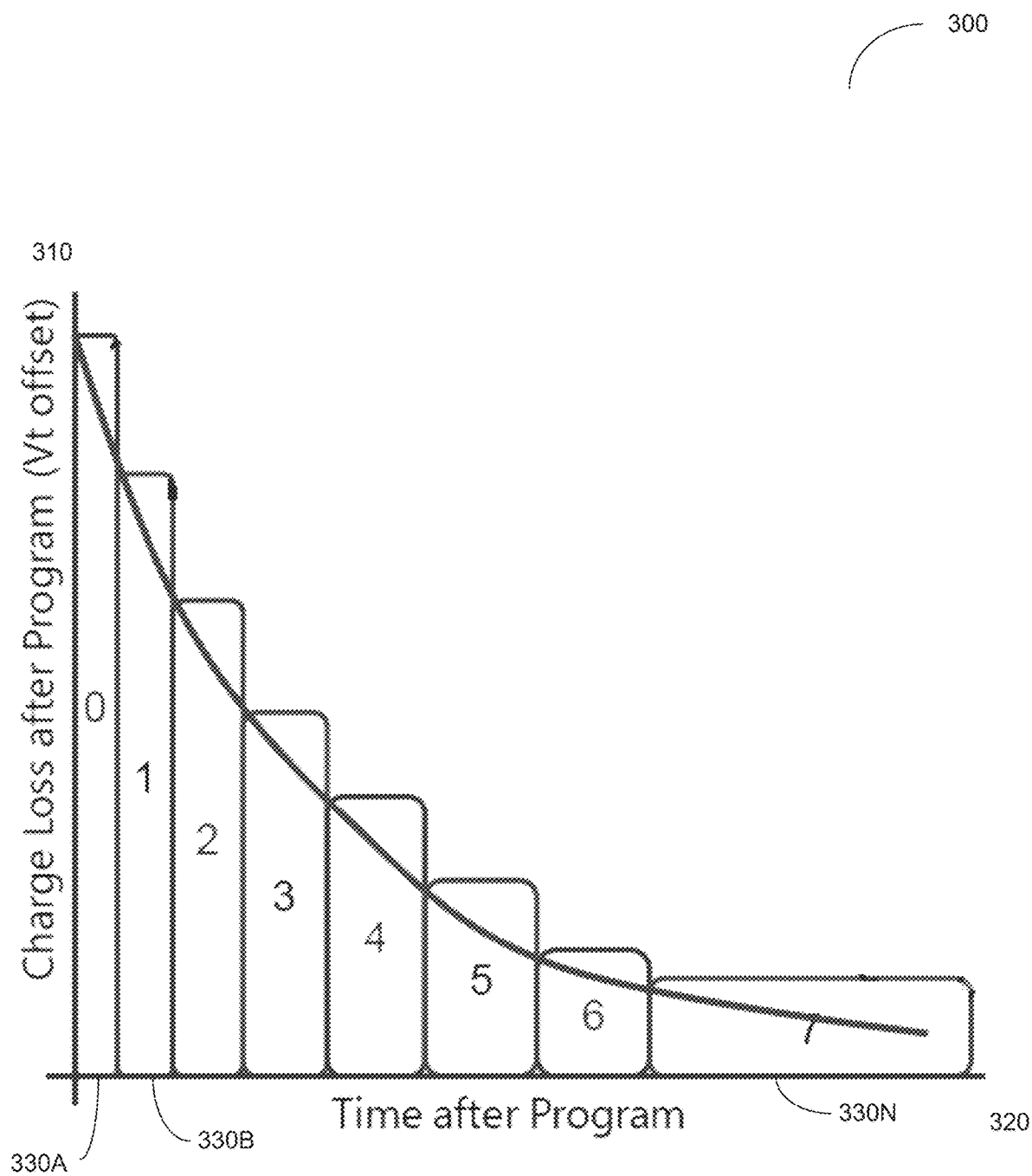
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph 300 illustrating the dependency of the threshold voltage offset 310 on the time after program 320 (i.e., the period of time elapsed since the block had been programmed. As schematically illustrated by FIG. 3, blocks of the memory device are grouped into block families 330A-330N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 310 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefines threshold voltage offset bins (bins 0-7 in the illustrative example of FIG. 3), which is in turn associated with the voltage offset to be applied for read operations. The associations of blocks with block families and block families and dies with threshold voltage offset bins can be stored in respective metadata tables maintained by the memory sub-system controller.

Figure 4:
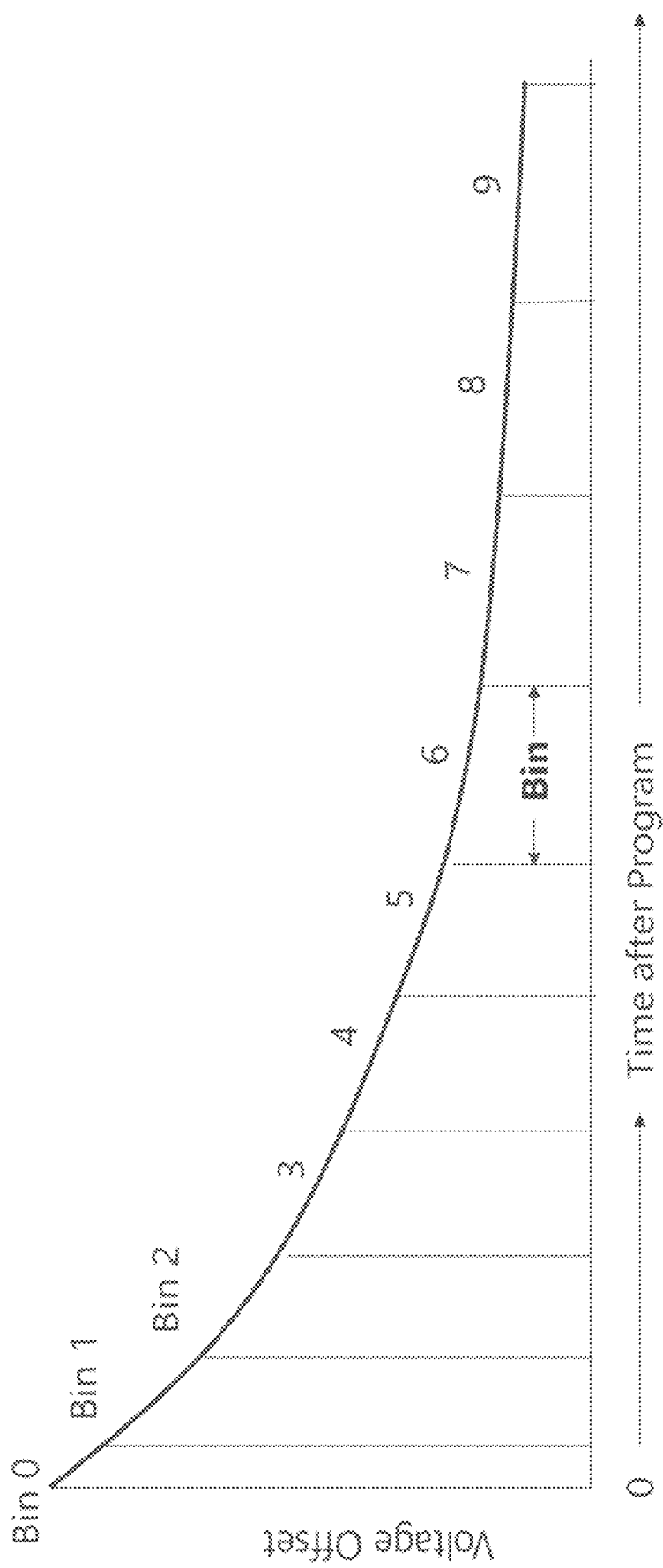
FIG. 4 schematically illustrates a set of predefined threshold voltage offset bins, in accordance with embodiments of the present disclosure.

FIG. 4 schematically illustrates a set of predefined threshold voltage offset bins (bin 0 to bin 9), in accordance with embodiments of the present disclosure. As schematically illustrated by FIG. 4, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

Figure 5:
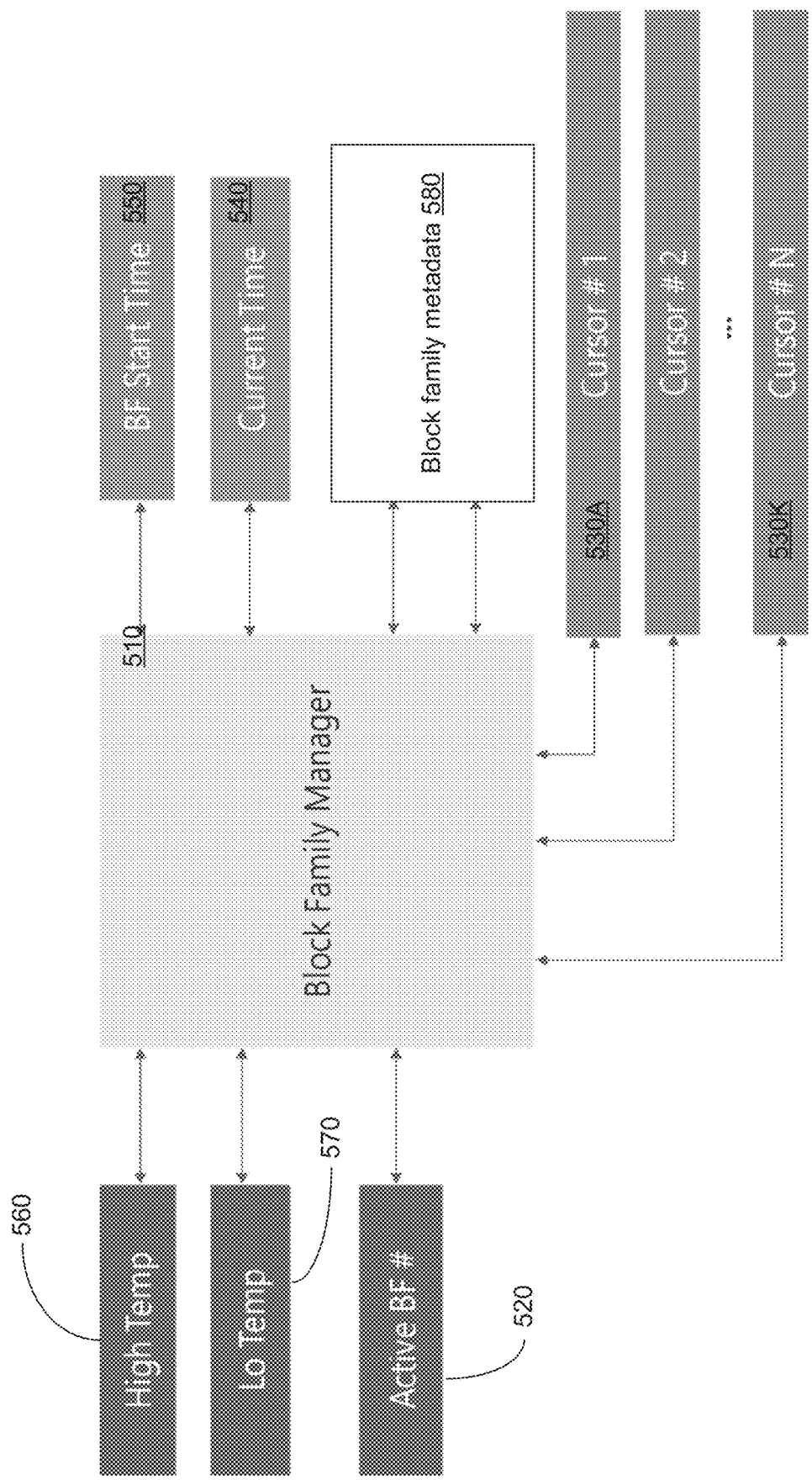
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration process, the memory sub-system controller associates each die of every block family with a threshold voltage offset bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation.

Figure 6:
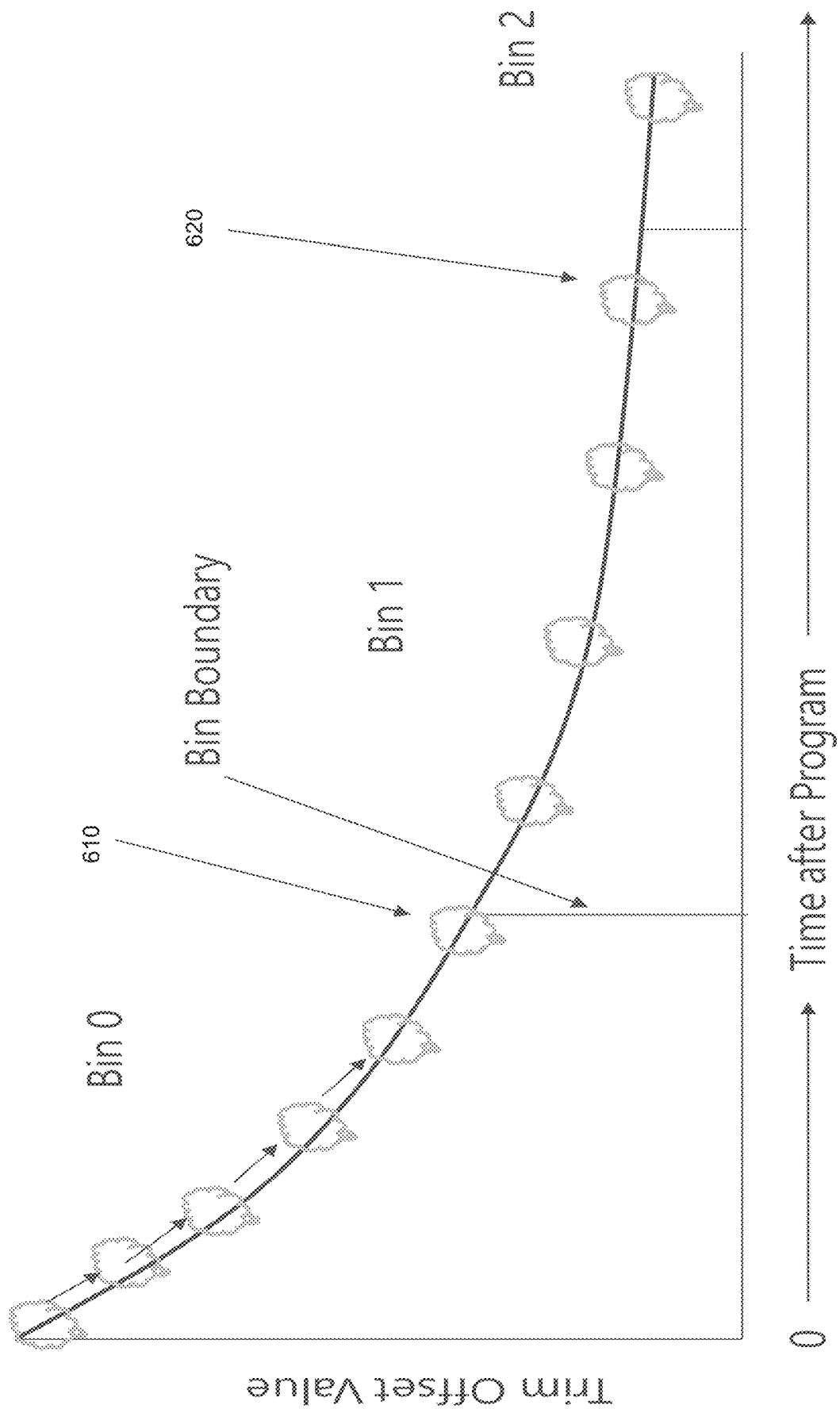
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each bin (e.g., block family 610 in bin 0 and block family 620 in bin 1), since it is the oldest block family that will, due to the slow charge loss, migrate to the next bin before any other block family of the current bin.

Figure 7:
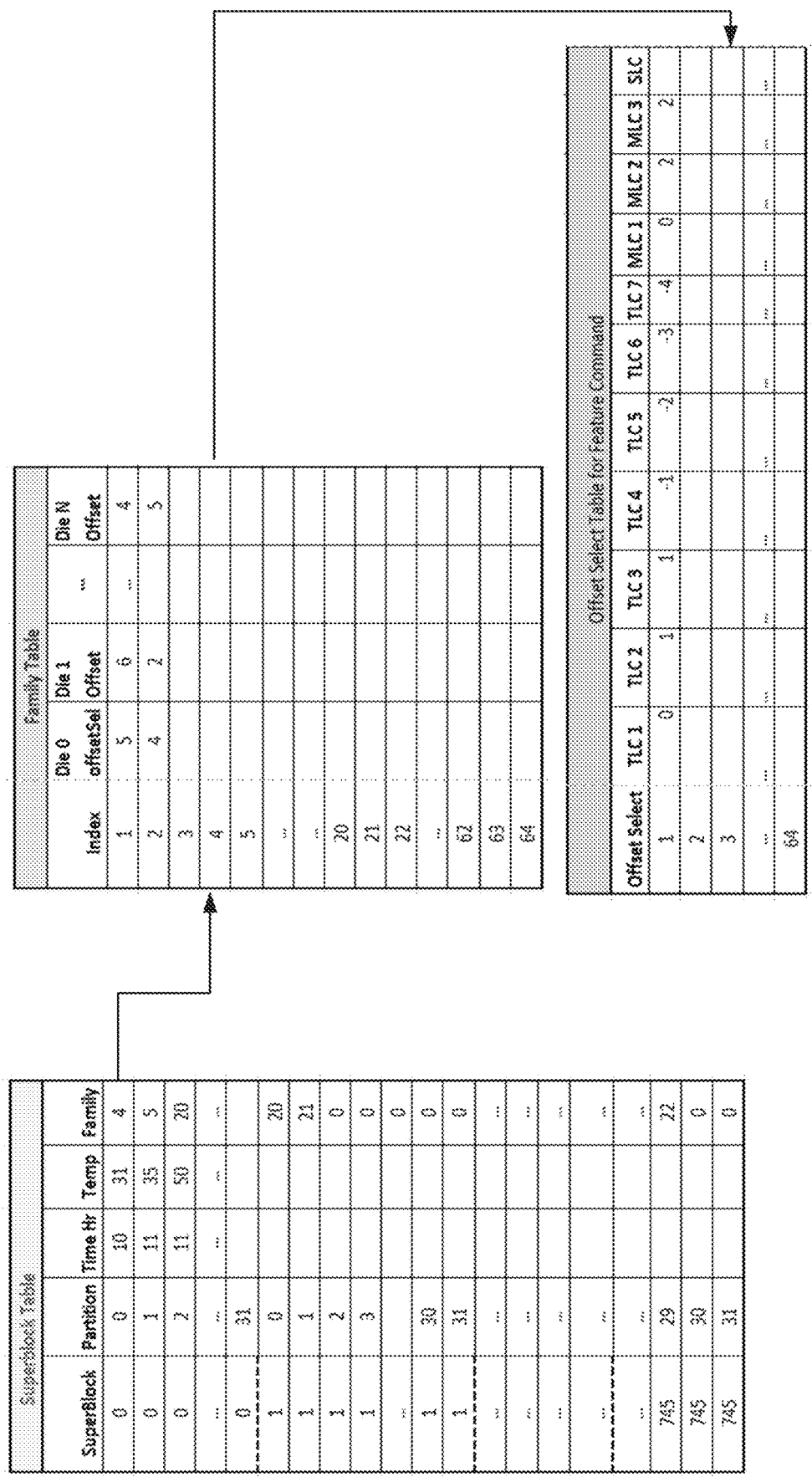
FIG. 7 schematically illustrates example metadata maintained by the memory sub-system controller for associating blocks and/or partitions with block families, in accordance with embodiments of the present disclosure.

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time and temperature values associated with the specified superblock and partition combination.

The family table 720 is indexed by the block family number, such that each record of the family table 720 specifies, for the block family referenced by the index of the record, a set of threshold voltage offset bins associated with respective dies of the block family. In other words, each record of the family table 720 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 730 is indexed by the bin number. Each record of the offset table 730 specifies a set of threshold voltage offsets (e.g., for TLC, MLC, and/or SLC) associated with threshold voltage offset bin.

When combining two block families, e.g., by merging the blocks of a first block family into a second block family, then deleting the first block family, the metadata tables 710-730 can be updated as a result of combining the two block families. For example, that superblock table 710 can be updated to reflect that superblock and partition combinations of the first block family should be associated with the second block family. Similarly, the family table 720 can be updated to delete a record associated with the first block family from family table 720.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, the block family identifier is used as the index to the family table 720 in order to determine the threshold voltage offset bin associated with the block family and the die; finally, the identified threshold voltage offset bin is used as the index to the offset table 730 in order to determine the threshold voltage offset corresponding to the bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that die 0 is mapped to bin 3. The latter value is used as the index to the offset table in order to determine the threshold voltage offset values for bin 3.

Figure 8:
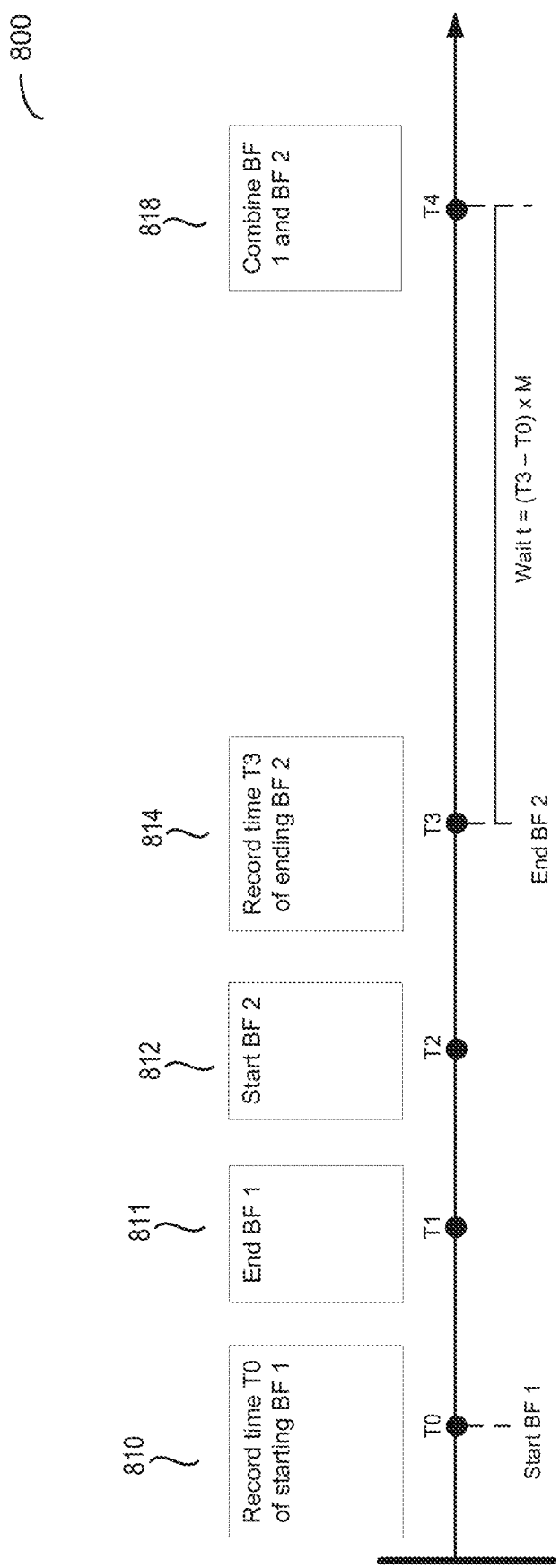
FIG. 8 depicts a sequence diagram illustrating the flow of events for an example method 800 of combining two block families upon satisfying a time-based combining criterion, in accordance with one or more aspects of the present disclosure.

FIG. 8 depicts a sequence diagram illustrating the flow of events for an example method 800 of combining two block families upon satisfying a time-based combining criterion, in accordance with one or more aspects of the present disclosure. Method 800 may be performed by processing logic that includes hardware (e.g., circuitry, dedicated logic, programmable logic, microcode, etc.), software (e.g., instructions run on a processor to perform hardware simulation), or a combination thereof. In some embodiments, the method 800 is performed by block family combination component 113 of FIG. 1.

Method 800 starts at operation 810. At operation 810 the processing logic at time T0 starts a new block family BF 1 to assign to BF 1 blocks that are programmed between T0 and the time of ending BF 1. The processing logic can further record time T0 of starting BF 1, in order to utilize T0 in calculating a time-based combining criterion for combining BF 1 with another block family, as explained in more details herein.

At operation 811, the processing logic at time T1 ends BF 1 by determining that another block family can be the currently active block family in the memory sub-system. In implementations, BF 1 can be ended upon determining that a predetermined duration for the currently active block family has elapsed since T0. At operation 812, the processing logic at time T2 starts a new block family BF 2 by assigning BF 2 as the currently active block family in the memory sub-system. In one example, BF 2 can be a block family directly following BF 1 as the currently active block family. In another example, BF 2 can be a block family started at some point in time after the ending of BF 1, but not necessarily directly following BF 1 as the currently active block family.

At operation 814, the processing logic at time T3 ends BF 2 by determining that a third block family can be the currently active block family in the memory sub-system. The processing logic can further record time T3 as the end time of BF 2, in order to utilize T3 in calculating a time-based combining criterion for combining BF 1 and BF 2. In implementations, the processing logic can determine the time period between the two recorded time; T3 of ending BF 2 and T0 of starting BF 1. If the determined time period is equal to or less than a predetermined number of minutes (e.g., 60 minutes), the processing logic can determine that BF 1 and BF 2 are adjacent block families, and that the two block families can be combined after a certain time-based criterion has elapsed since the end of BF 2. In an example, the time-based criterion can be a time multiplier of the determined time period of T3−T0. In this case, the processing logic can determine that since BF 1 and BF 2 are adjacent block families, the threshold voltages of the two block families are likely to converge to similar values after the passage of a certain period of time that can be calculated based on the difference between the starting time and the closing time of the adjacent block families.

At operation 818, the processing logic at time T4 can determine that the time multiplier has elapsed since T3, the processing logic can then combine BF 1 and BF 2. In implementations, the processing logic can combine the two block families by merging the blocks of BF 1 into BF 2 (e.g., by assigning blocks of BF 1 to BF 2), and then deleting BF 1 from block family metadata tables of the memory subsystem controller.

Figure 9:
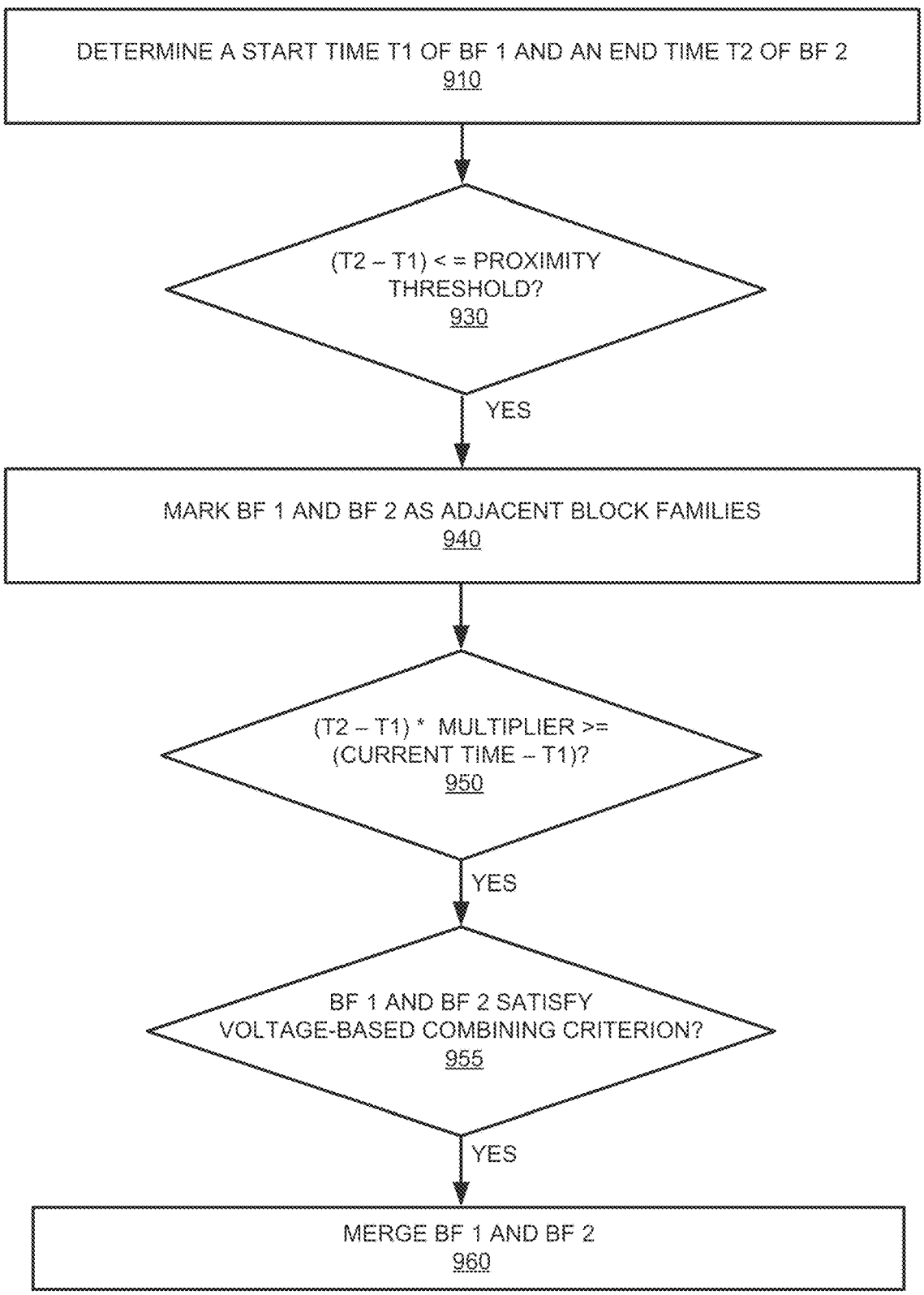
FIG. 9 is a flow diagram of an example method of performing a block family combination based on a time-based combining criterion and a voltage-based combining criterion in a memory sub-system, in accordance with some embodiments of the present disclosure.

FIG. 9 is a flow diagram of an example method of performing a block family combination based on a time-based combining criterion and a voltage-based combining criterion in a memory sub-system, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family combination component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic determines time T1 at the time of starting a block family BF 1, and another time T2 as the time of ending a block family BF 2. In implementations, the processing logic can determine that BF 1 and BF 2 are adjacent when the difference between the end time of BF 2 and the start time BF 1 is equal to, or less than, a predetermined time period (e.g., 1 hour).

Accordingly, at operation 930, the processing logic determine whether the difference between T2 and T1 satisfies the proximity threshold (e.g., 1 hour) to determine whether or not the two block families are adjacent. At operation 940, the processing logic determines that BF 2 and BF 1 are adjacent because (T2–T1) satisfy the proximity condition. The processing logic may then mark BF 1 and BF 2 as adjacent block families, for example, in a metadata table of the memory sub-system.

At operation 950, given that BF 1 and BF 2 are adjacent, the processing logic can determine whether or not a certain time multiplier of (T2–T1) has elapsed since T1 (the start of BF 1). In implementation, the processing logic can determine that BF 1 and BF 2 satisfy a time-based combining criterion when a time multiplier (e.g., 24) of the difference between T2 and T1 has elapsed, as explained in more details herein above.

At operation 955, by determining that the time-based combining criterion has elapsed, the processing logic can further determine whether or not a voltage-based combining criterion is satisfied. In one implementation, satisfying the voltage-based criterion can be done by determining whether a data state metric of BF 1 is within a predetermined variance of a data state metric of BF 2. A data state metric of a block family can indicate the temporal voltage shift (TVS) of the blocks associated with the block family. As an example, if an average threshold voltage of BF 1 is within 3 units of Digital to Analog Conversion (DAC)s from the average threshold voltage of BF 2, then the BF 1 and BF 2 satisfy the voltage-based combining criterion.

At operation 960, when the processing logic determines that BF 1 and BF satisfy the voltage-based combining criterion, the processing logic can combine BF 1 and BF 2, e.g., by merging blocks of BF 1 into BF 2 and then deleting BF 1, as explained in more details herein.

Figure 10:
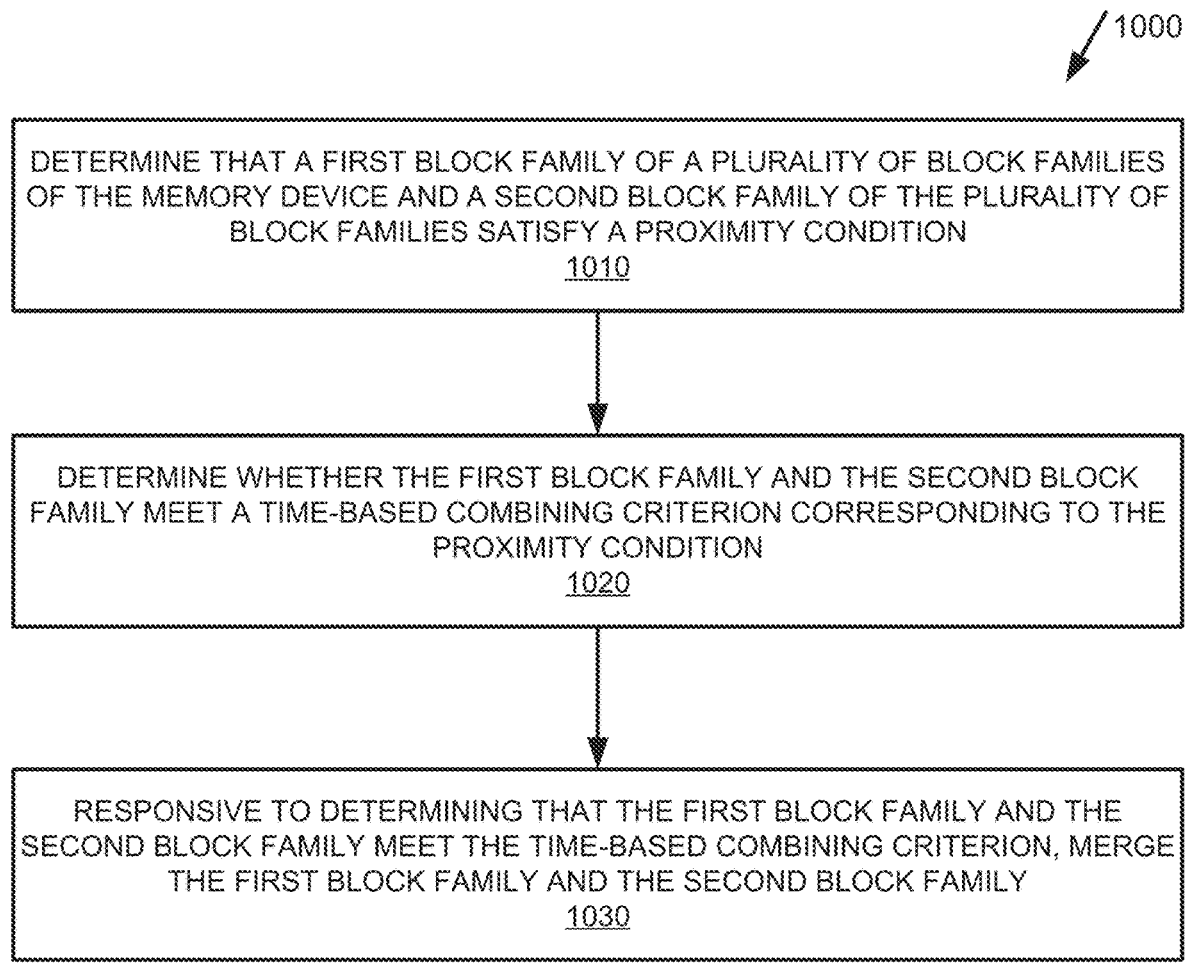
FIG. 10 is a flow diagram of an example method of performing a block family combination based on a time-based combining criterion in a memory sub-system, in accordance with some embodiments of the present disclosure.

FIG. 10 is a flow diagram of an example method of performing a block family combination based on a time-based combining criterion in a memory sub-system, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family combination component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1010, the processing logic determines that two block families out of the group of block families within the memory device satisfy a proximity condition. In implementations, the proximity condition can be determining that the difference between the start time of one block family and the end time of the other block family does not exceed a predetermined period of time (e.g., 1 hour), as explained in more details herein.

At operation 1020, based on determining that the two block families satisfy the proximity condition, the processing logic determines that the two block families are adjacent, and accordingly can be combined when a time-based combining criterion is met. In implementations, the processing logic can determine that the two block families can be combined when a second time period has elapsed since the start of the first block family. As an example, the second time period can be a time multiplier of the predetermined period of time (e.g., 24 hours).

At operation 1030, upon determining that the time-based combining criterion has been met (e.g., 24 hours has elapsed since the start of the first block family), the processing logic can determine that the two block families can be combined. In implementations, the processing logic can merge the first block family and the second block family by assigning blocks of the first block family to the second block family and then deleting the first block family, as explained in more details herein above.

Figure 11:
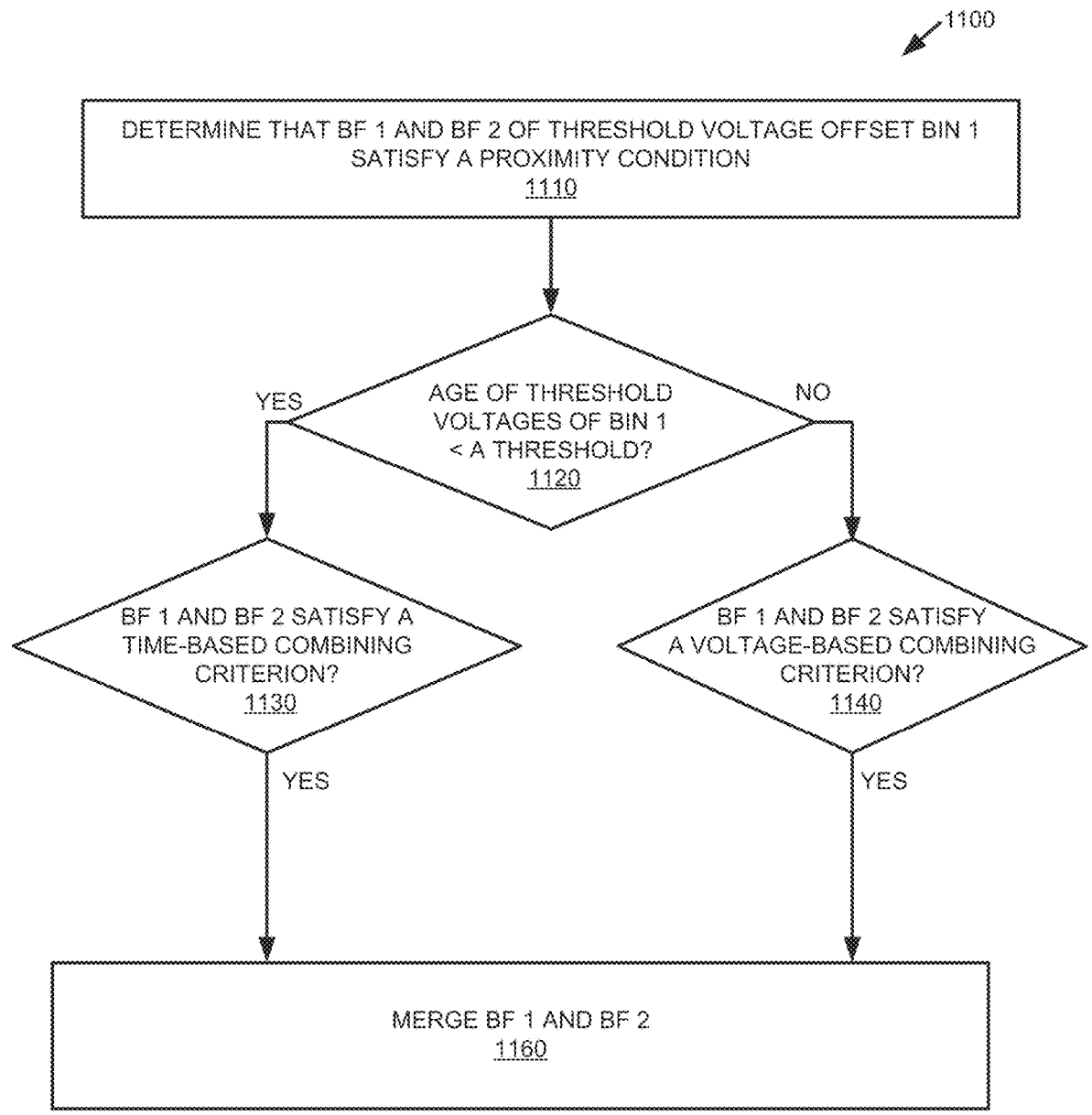
FIG. 11 is a flow diagram of an example method of performing a block family combination based on a time-based combining criterion or a voltage-based combining criterion in a memory sub-system, in accordance with some embodiments of the present disclosure.

FIG. 11 is a flow diagram of an example method of performing a block family combination based on a time-based combining criterion or a voltage-based combining criterion in a memory sub-system, in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the block family combination component 113 of FIG. 1.

Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1110, the processing logic determines that two block families, BF 1 and BF 2 of a threshold voltage offset bin 1 (Bin 1) of a memory device satisfy a proximity condition. In implementations, the proximity condition can be determining that the difference between the start time of BF 1 and the end time of BF 2 does not exceed a predetermined period of time (e.g., 1 hour), as explained in more details above.

At operation 1120, the processing logic determines whether Bin 1 satisfy an age criterion. In certain implementations, an age of a threshold voltage offset bin is determined based on a time after program value that is associated with the threshold voltage offset bin. Accordingly, an age criterion of Bin 1 can be determining whether the time after program that is associated with Bin 1 exceeds a threshold. When the time after program for a given threshold voltage offset bin is short, the frequency of change in threshold voltage offsets associated with the bin can be high, thus measuring a data state for determining a voltage-based criterion for block families assigned to the bin can be inaccurate and/or expensive to perform. On the other hand, when the time after program for the bin is long, the frequency of change in threshold voltage offsets associated with the bin can be low, thus measuring the data state for determining a voltage-based criterion for block families assigned to the bin can be more accurate and/or less expensive than it is when the time after program is short. Therefore, the processing logic can use a time-based combining criterion for combining block families assigned to young bins and a voltage-based combining criterion for combining block families assigned to old bins.

Accordingly, at operation 1130, when the processing logic determines that the age of Bin 1 is below a threshold (i.e., a young bin), the processing can determine whether or not BF 1 and BF 2 satisfy a time-based combining criterion, e.g., the passage of a certain time period that is associated with the start time of BF 1 and the end time BF 2, to combine BF 1 and BF 2. At operation 1160, if BF 1 and BF 2 satisfy the time-based combining criterion, the processing logic can merge BF 1 and BF 2, as explained in more details herein above.

On the other hand, at operation 1140, when the processing logic determines that the age of Bin 1 is not below the threshold (i.e., an old bin), the processing can determines whether or not BF 1 and BF 2 satisfy a voltage-based combining criterion, e.g., by measuring and comparing a data state metric for BF 1 and BF 2, in order to combine BF 1 and BF 2. At operation 1160, if BF 1 and BF 2 satisfy the voltage-based combining criterion, the processing logic can merge BF 1 and BF 2, as explained in more details herein above.

Figure 12:
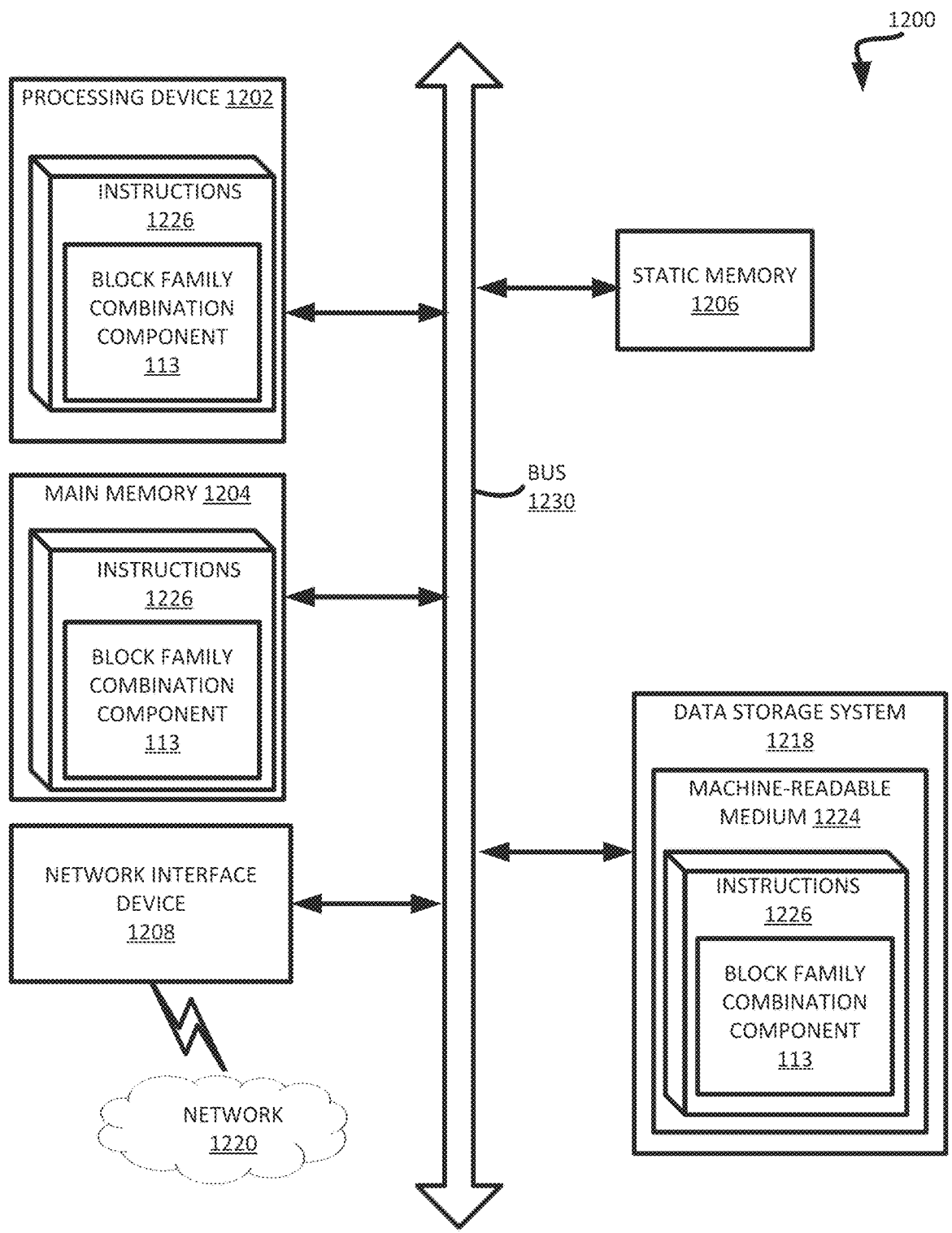
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to block family combination component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to block family combination component 113 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, the processing device is to perform operations comprising:
determining that a first block family of a plurality of block families of the memory device and a second block family of the plurality of block families satisfy a proximity condition, wherein the first block family is associated with a first set of voltage offsets to be applied to a first plurality of blocks of the first block family, and wherein the second block family is associated with a second set of voltage offsets to be applied to a second plurality of blocks of the second block family;
determining whether the first block family and the second block family meet a time-based combining criterion, wherein the time-based combining criterion is based on a multiplier of a time period that has elapsed since a time of starting the first block family, wherein the multiplier is adjusted based on a temperature of the memory device; and
responsive to determining that the first block family and the second block family meet the time-based combining criterion, merging the first block family and the second block family.

2. The system of claim 1, wherein the proximity condition comprises the time period between the time of starting the first block family and a time of ending the second block family.

3. The system of claim 2, wherein the multiplier is adjusted based on voltage offsets of a threshold voltage offset bin.

4. The system of claim 1, wherein the first block family and the second block family are assigned to a first threshold voltage offset bin.

5. The system of claim 4, wherein the operations further comprise:
determining that a third block family and a fourth block family satisfy the proximity condition;
responsive to determining that the third block family and the fourth block family are assigned to a second threshold voltage offset bin, determining whether the third block family and the fourth block family meet a second time-based combining criterion; and
responsive to determining that the third block family and the fourth block family meet the second time-based combining criterion, merging the third block family and the fourth block family.

6. The system of claim 4, wherein the operations further comprise:

determining that a third block family and a fourth block family satisfy the proximity condition;

responsive to determining that the third block family and the fourth block family are assigned to a second threshold voltage offset bin, determining whether the third block family and the fourth block family meet a voltage-based combining criterion, wherein the second threshold voltage offset bin corresponds to a time after program that is longer than a second time after program that corresponds to the first threshold voltage offset bin; and responsive to determining that the third block family and the fourth block family meet the voltage-based combining criterion, merging the third block family and the fourth block family.

7. The system of claim 1, wherein the operations further comprise:

updating the time-based combining criterion upon detecting a change in the temperature of the memory device.

8. A method comprising:

determining that a first block family of a plurality of block families of a memory device and a second block family of the plurality of block families satisfy a proximity condition, wherein the first block family is associated with a first set of voltage offsets to be applied to a first plurality of blocks of the first block family, and wherein the second block family is associated with a second set of voltage offsets to be applied to a second plurality of blocks of the second block family;

determining whether the first block family and the second block family meet a time-based combining criterion, wherein the time-based combining criterion is based on a multiplier of a time period that has elapsed since a time of starting the first block family, wherein the multiplier is adjusted based on voltage offsets associated with a threshold voltage offset bin;

responsive to determining that the first block family and the second block family meet the time-based combining criterion, determining whether the first block family and the second block family meet a voltage-based combining criterion; and responsive to determining that the first block family and the second block family meet the voltage-based combining criterion, merging the first block family and the second block family.

9. The method of claim 8, wherein the proximity condition comprises the time period between the time of starting the first block family and a time of ending the second block family.

10. The method of claim 8, wherein the multiplier is adjusted based on a temperature of the memory device.

11. The method of claim 8, wherein the first block family and the second block family are assigned to the threshold voltage offset bin.

12. The method of claim 11 further comprising:

determining that a third block family and a fourth block family satisfy the proximity condition;

responsive to determining that the third block family and the fourth block family are assigned to a second threshold voltage offset bin, determining whether the third block family and the fourth block family meet a second time-based combining criterion associated with the second threshold voltage offset bin; and responsive to determining that the third block family and the fourth block family meet the second time-based combining criterion and the voltage-based combining criterion, merging the third block family and the fourth block family.

13. The method of claim 8, wherein the voltage-based combining criterion is based on a data state metric of each block family of the plurality of block families.

14. The method of claim 8 further comprising:

updating the time-based combining criterion upon detecting a change in a temperature of the memory device.

15. A non-transitory computer-readable storage medium comprising instructions that, when executed by a processing device, cause the processing device to:

determine that a first block family of a plurality of block families of a memory device and a second block family of the plurality of block families satisfy a proximity condition;

determine whether the first block family and the second block family meet a time-based combining criterion corresponding to the proximity condition; and responsive to determining that the first block family and the second block family meet the time-based combining criterion, merge the first block family and the second block family, wherein the first block family and the second block family are assigned to a first threshold voltage offset bin, and wherein the first threshold voltage offset bin defines voltage offsets to be applied for a read operation same for all block families associated with the first threshold voltage offset bin;

determine that a third block family and a fourth block family satisfy the proximity condition, responsive to determining that the third block family and the fourth block family are assigned to a second threshold voltage offset bin, determine whether the third block family and the fourth block family meet a voltage-based combining criterion, wherein the second threshold voltage offset bin corresponds to a time after program that is longer than a second time after program that corresponds to the first threshold voltage offset bin; and responsive to determining that the third block family and the forth block family meet the voltage-based combining criterion, merge the third block family and the fourth block family.

16. The non-transitory computer-readable storage medium of claim 15, wherein the proximity condition comprises a time period between a time of starting the first block family and a time of ending the second block family.

17. The non-transitory computer-readable storage medium of claim 16, wherein the time-based combining criterion comprises a multiplier of the time period.

18. The non-transitory computer-readable storage medium of claim 15, wherein the processing device is further to:

responsive to determining that the third block family and the fourth block family are assigned to the second threshold voltage offset bin, determine whether the third block family and the fourth block family meet a second time-based combining criterion; and responsive to determining that the third block family and the fourth block family meet the second time-based combining criterion, merge the third block family and the fourth block family.

* * * * *